United States Patent [19]

Spitzer et al.

[11] 4,291,817
[45] Sep. 29, 1981

[54] WEATHERPROOF PANEL ENCLOSURE

[76] Inventors: Erlys C. Spitzer; Frank Spitzer, both of 9782 S. Crestview Cir., Villa Park, Calif. 92667

[21] Appl. No.: 157,862

[22] Filed: Jun. 9, 1980

[51] Int. Cl.³ .............................................. B65D 45/00
[52] U.S. Cl. .................................... 220/327; 220/3.8; 174/35 R; 174/35 GC; 174/50; 174/66
[58] Field of Search ................... 220/3.8, 306, 85 TC, 220/327, 328; 174/35 R, 35 GC, 50, 66

[56] References Cited
U.S. PATENT DOCUMENTS

| | | | |
|---|---|---|---|
| 428,422 | 5/1890 | Skinner | 220/327 |
| 3,391,821 | 7/1968 | Satz | 220/308 |
| 3,515,423 | 6/1970 | DeSmidt | 220/210 X |

*Primary Examiner*—George T. Hall
*Attorney, Agent, or Firm*—Ralph B. Pastoriza

[57] ABSTRACT

The panel enclosure is used to house electrical equipment and not only shields the equipment from stray RF fields but also protects the equipment against water, moisture and the like. The enclosure is in the form of a shallow rectangular box having an opening outlined by an upwardly sloping flange. A cover has a downwardly depending skirt or lip which overlaps the flange, the cover including an interior gasket which is positioned to seat over the entire perimeter of the flange. One side of the cover is hinged to the box and the other side has securing bolts passing through the lip to engage the sloping surface of the flange. By threading the bolts inwardly, the cover is cammed into tight engagement with the gasket to provide the desired weatherproof features.

7 Claims, 8 Drawing Figures

WEATHERPROOF PANEL ENCLOSURE

This invention relates generally to enclosures and more particularly to an improved weatherproof panel enclosure primarily for housing electrical equipment.

BACKGROUND OF THE INVENTION

The specifications for weatherproof panel enclosures to house electrical equipment have been fairly standardized throughout the industry. Thus, while there are provisions for different sizes or different dimensioned enclosures, each of the enclosures must meet certain specific requirements relating to weatherproofing, proper RF shielding, and the like.

The prior art enclosures of which we are aware all include a shallow rectangular box having a cover hinged along one side and an appropriate fastening or securing arrangement along the other side. However, the securing arrangement itself usually takes the form of a C-shaped bracket member having a bolt receiving opening so that it can be threaded downwardly with the arm portions of the bracket engaging over an upturned lip of the cover so that the threading downwardly of the securing bolt will urge the cover downwardly.

One problem with enclosures of the foregoing type is the fact that the bolts and C-shaped clamps can become separated or lost. Another problem is that they are somewhat difficult to manually manipulate. Still another problem is that of difficulty in providing a consistent closing pressure on the cover so that if the C-shaped clamps are not threaded down sufficiently, the cover will cant in one direction whereas if they are bolted down too far, or too tightly, the cover will cant in another direction and possibly strain the hinge structure.

BRIEF DESCRIPTION OF THE PRESENT INVENTION

With the foregoing considerations in mind, the present invention contemplates the provision of an improved weatherproof panel enclosure wherein the foregoing problems are overcome.

More particularly, and in its broadest aspect, the present invention includes a box having an opening, the periphery of the opening being defined by an integral flange having an outward sloping portion. A cover is provided with a peripheral lip dimensioned to overlap the integral flange when the cover is closed over the opening. The cover is hinged along one side at its lip portion to the box. Securing means are provided passing laterally through the opposite side of the lip portion to engage the sloping surface of the flange. By threading the securing means inwardly, the ends of the securing means will engage the sloping surface and cam the cover into tight engagement with the flange.

In the preferred embodiment, latch members having padlock openings are provided and so dimensioned as to be in proper registration when the cover is properly in closure position over the flange. It is thus very easy to close the cover and make sure that it engages the flange in a consistent manner; that is, without canting in one direction or the other.

The securing means themselves are in the form of bolts having reduced diameter shaft portions serving to render them captive to the lip of the cover so that there is no possibility of the bolts becoming inadvertently separated or lost.

BRIEF DESCRIPTION OF THE DRAWINGS

A better understanding of this invention as well as further features and advantages thereof will be had by now referring to the accompanying drawings in which.

BRIEF DESCRIPTION OF THE PREFERRED EMBODIMENT

Figure 1:
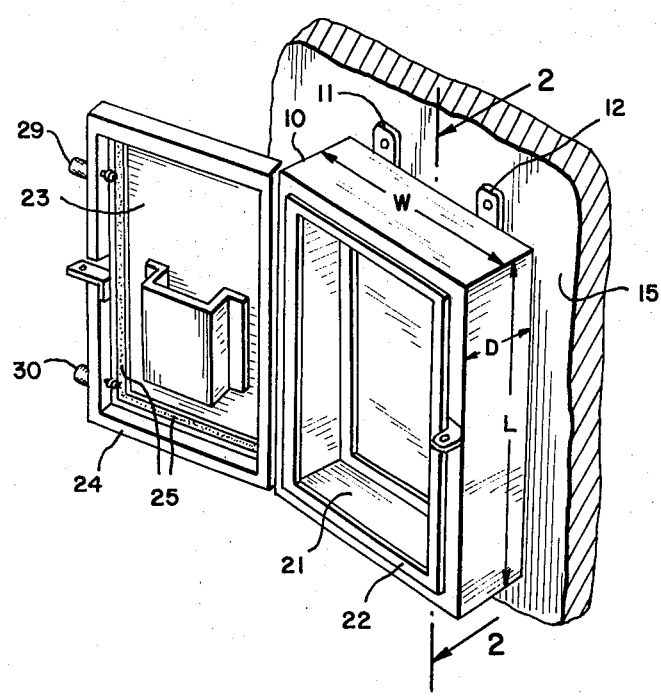
FIG. 1 is a perspective view of the weatherproof panel enclosure of this invention showing the cover of the enclosure in open position and the enclosure itself mounted vertically on a wall.
Figure 2:
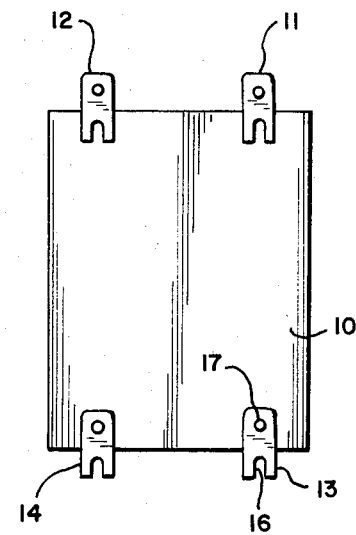
FIG. 2 is a rear elevational view of the enclosure taken in the direction of the arrows 2—2 of FIG. 1.

Referring to FIGS. 1 and 2 together, the weatherproof panel enclosure includes a shallow rectangular box structure 10 having length, width and depth dimensions indicated by the letters L, W and D. The depth dimension D is normally less than ½ the width. The box itself has upper and lower mounting means in the form of plates 11, 12, 13 and 14 for mounting the box to a vertical wall 15 with its depth dimension normal to the wall surface.

As best seen in FIG. 2, the mounting means in the form of the plates are identical, each having a slot extending into one end and an opening adjacent to its opposite end. Such a slot and opening are indicated at 16 and 17 by way of example for the plate 13.

The upper mounting means in the form of the plates 11 and 12 have their first mentioned one ends welded adjacent to the upper rear corners of the box 10. Similarly, the lower mounting means in the form of the plates 13 and 14 have their opposite ends welded adjacent to the lower rear corners of the box.

With the foregoing arrangement, the lower plates have their associated slots such as the slot 16 facing downwardly and exposed while the upper plates have only the openings exposed.

Figure 3:
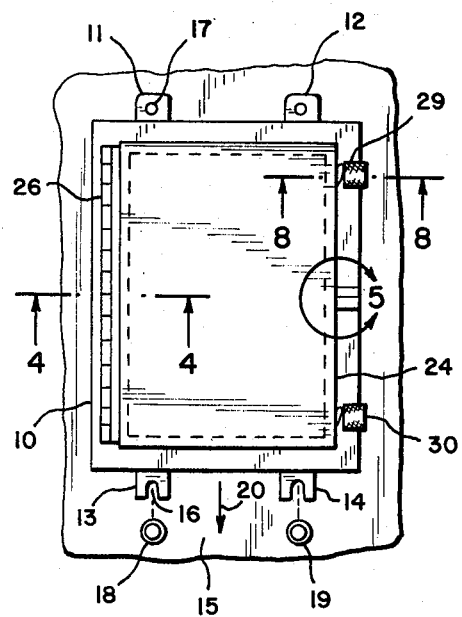
FIG. 3 is a full front elevational view of the enclosure showing the cover in closed position.

With particular reference to FIG. 3, the provision of the slots on the lower plates facilitates mounting of the box on the wall surface 15, the slots themselves receiving partially secured bolts 18 and 19 in the wall surface when the box is moved downwardly in the direction of the arrow 20. After the bolts 18 and 19 have been received in the slots of the plates 13 and 14, the upper plates 11 and 12 can then receive bolts through their openings such as the opening 17 to complete the securement to the wall surface.

Referring back to FIG. 1, the box itself has a front rectangular opening 21 defined by an integral surrounding flange 22 about the complete periphery of the opening.

A rectangular cover 23 has a lip 24 about its entire perimeter and is dimensioned such that the lip overlaps the flange when the cover is closed over the opening 21. Within the inside undersurface of the cover 23 there is provided a gasket 25 running about the entire inside periphery of the cover adjacent to the inside surfaces of the lip 24. This gasket provides for a proper sealing against the top surface of the flange 22 of the box when the cover is in its proper closed position.

Figure 4:
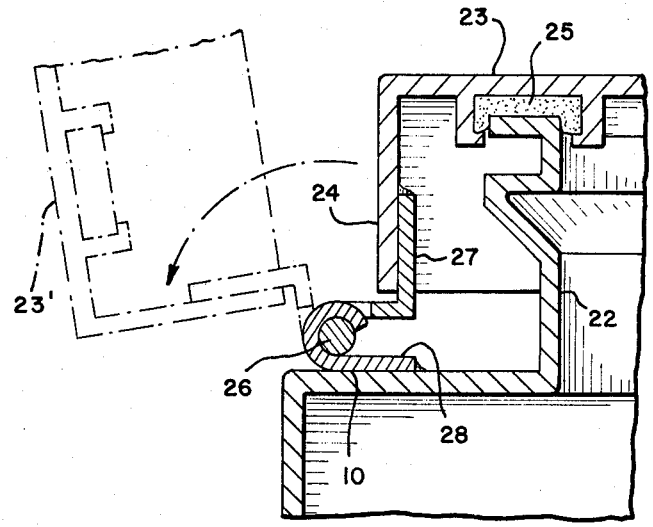
FIG. 4 is an enlarged fragmentary cross section taken in the direction of the arrows 4—4 of FIG. 3.

Referring now particularly to FIG. 4, there is shown a hinge 26 having one hinge portion 27 secured to a portion of the lip 24 for the cover 23, preferably on the inside of this lip. Another portion of the hinge 26 indicated at 28, in turn, is secured to the front side of the box between the flange 22 and the front side edge of the box itself. With this arrangement, the cover can be swung away from the opening to the position such as illustrated in dotted lines through an angle greater than 90°. In fact, the cover could be open a full 180°. Moreover, it will be evident that by the hinge arrangement described, when the cover 23 is closed, the heretofore referred to gasket 25 will engage the top of the integral flange 22 running along the same side as the hinge.

Appropriate securing means in the form of bolts 29 and 30 as shown in FIGS. 1 and 3, pass through a lip portion of the vertical side of the cover opposite the side secured to the hinge. These fastening means are arranged to engage the integral flange overlapped by the latter mentioned lip portion of the cover. Further details of this securing arrangement will become evident as the description proceeds.

Figure 5:
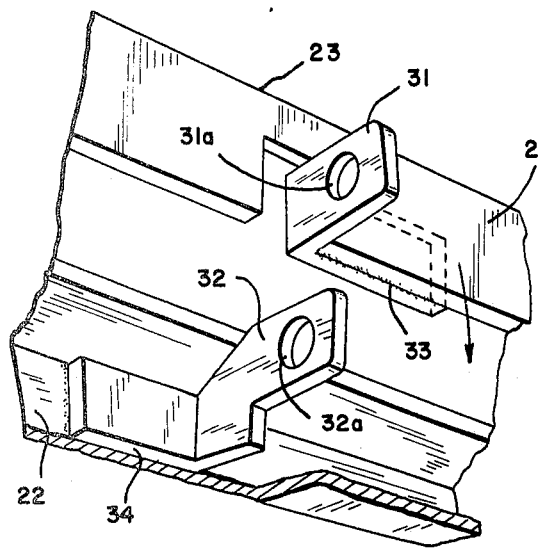
FIG. 5 is a fragmentary perspective view showing the cover in the process of being closed wherein appropriate padlock latch members are illustrated.

Referring now to FIG. 5, there are shown latching members 31 and 32 having openings 31a and 32a for a padlock. These latching members are secured respectively to the lip portion 24 of the cover 23 as at 33 and the flange 22 overlapped by this lip portion when the cover is closed, as at 34.

These latch members are located intermediate the fastening means 29 and 30 as will be clear from FIG. 3. The positioning of the latch members and their openings 31a and 32a are such that when the cover is properly closed; that is, when the gasket 25 is in equal pressure engagement with the entire top perimeter of the flange 22 the openings 31a and 32a are in proper registration.

Figure 6:
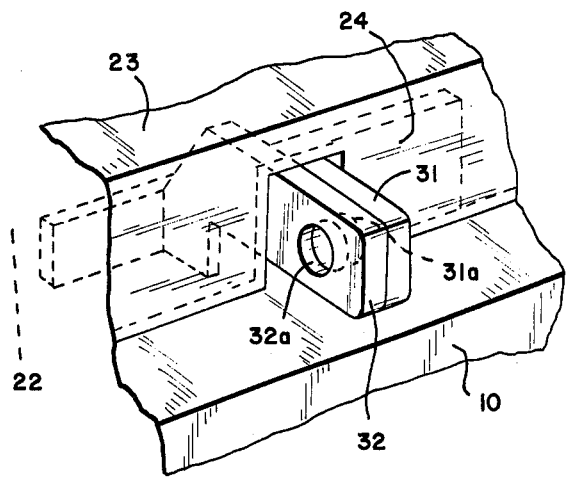
FIG. 6 is a view similar to FIG. 5 but showing the padlock latch members in registration indicating proper closure of the cover.

FIG. 6 shows this proper registration of the openings and the latch members thus serve as an indexing to proper positioning of the cover for optimum sealing. In other words, any canting of the cover in one direction or the other would bring the latch members out of registration with each other and thus be immediately evident.

Figure 7:
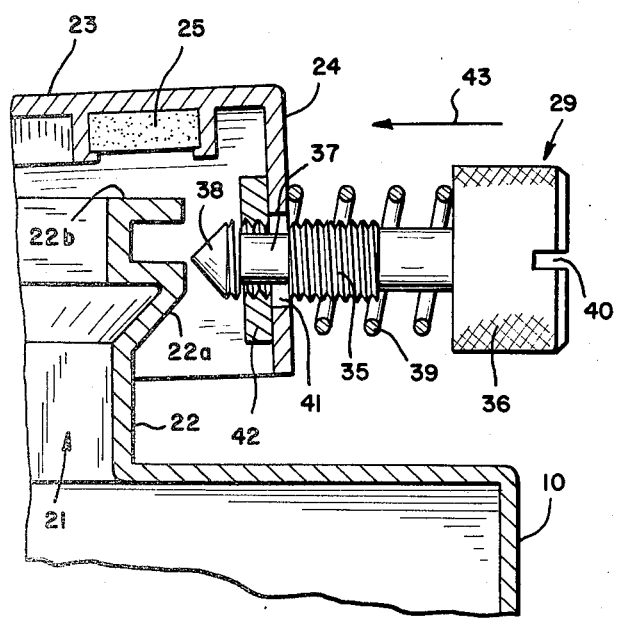
FIG. 7 is an enlarged fragmentary cross section of the cover and box but showing one of the securing means in full lines preparatory to securing the cover in completely closed position.
Figure 8:
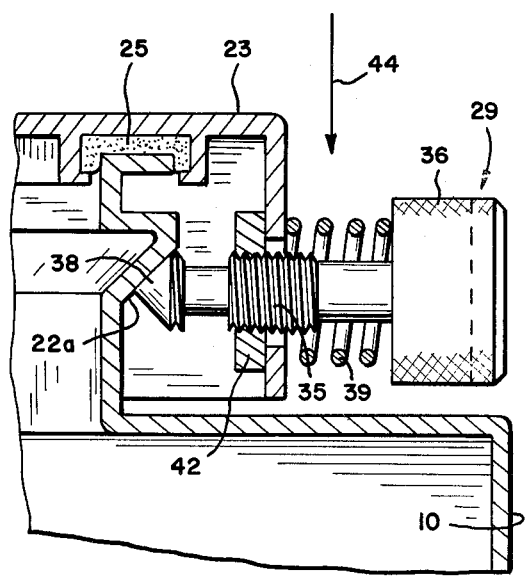
FIG. 8 is a view similar to FIG. 7 but showing the cover member in its completely closed position.

Referring now to FIGS. 7 and 8, final details of the preferred form of the securing means will become evident. Since each of the securing means 29 and 30 described in FIGS. 1 and 3 are essentially identical, a description of the operation of one will suffice for both.

Referring first to FIG. 7 and considering specifically the securing means 29, it will be noted that this means comprises a threaded bolt 35 having a knurled head 36 and a reduced diameter smooth portion 37 intermediate the threads. The nose of the bolt terminates in a rounded surface 38 which functions as a camming surface.

a coiled compression spring 39 surrounds the main body portion of the bolt as shown and the knurled head itself is provided with an outer end slot 40 to facilitate turning of the bolt.

With the foregoing bolt structure, the same is passed through an opening 41 in the lip 24 of the cover. There is provided in registration with the opening 41 a threaded member 42 secured to the inside of the lip with threads to match the threaded portion 35 of the bolt.

The first threaded portion of the bolt adjacent to the nose 38 is threaded through the member 42 and past this member so that this member surrounds the reduced diameter smooth bore portion 37 as described. In this position, the bolt is loose in the opening but is held captive to prevent inadvertent loss. Further, in this position, the nose is retracted sufficiently that it will not interfere with the flange structure 22 of the box 10 in opening and closing the cover.

With respect to the foregoing, it will be noted that the integral flange 22 has a sloping portion 22a extending forwardly and outwardly towards the overlapping lip 24 of the cover. This structure then doubles back and terminates in a flat top surface 22b dimensioned to engage the gasket 25. The reason for the "C" cross section at the upper end of the flange structure is to provide the surface 22b in a raised position for proper engagement with the gasket 25 without interference with the threaded member 42 on the inside of the lip portion 24.

FIG. 8 shows the cover 23 in properly closed position wherein the gasket 25 is properly seated on the top surface 22b of the integral flange. It will be noted that the threaded bolt 35 described in FIG. 7 has been urged to the left as indicated by the arrow 43 after first applying downward pressure on the cover 23 to position the nose portion 38 at the upper inclined sloping surface portion 22a of the flange. If now further urging of the bolt inwardly takes place and the same is threaded so that the other threaded portion 35 engages the threads on the member 42, the rounded nose 38 will be moved further to the left and thus cam against the sloping surface 22a to cam the cover 23 downwardly in the direction of the arrow 44. The spring 39 will compress as threading of the bolt 35 by the knurled head 36 takes place. To facilitate the last few threading turns of the bolt where friction is fairly great because of the compression of the gasket, a coin or screwdriver may be used in the slot 40.

Turning of the bolts to cam the cover downwardly is continued until the latches 31 and 32 are in registration with each other as described in FIG. 6. In this position, it can be assured that the cover is then in full perimeter equal pressure engagement with the gasket 25 with the result of proper weatherproofing and sealing against moisture.

From all of the foregoing, it will thus be evident that the present invention has provided a greatly improved weatherproof panel enclosure wherein consistent and proper sealing of the cover is assured and wherein the securing means can be easily manually operated and are captured against inadvertent loss.

While only two fastening bolts on the front lip are shown, additional bolts can be provided on the front and sides of the cover for larger sized enclosures.

We claim:
1. A weatherproof panel enclosure including:
 (a) a box having an opening, the periphery of the opening being defined by an integral flange having an outward sloping portion;
 (b) a cover having a peripheral lip dimensioned to overlap said integral flange when the cover is closed over the opening;

(c) a gasket in the under top portion of said cover adjacent to the inside of said lip extending about the perimeter of the cover dimensioned to engage the top of said integral flange when the cover is in closed position to thereby provide a sealing relationship;

(d) hinge means secured to a lip portion extending along one side of the cover and a corresponding one side of the box between the flange and the side of the box itself so that said cover can be swung away from the opening through an angle greater than 90°; and (e) securing means passing through a lip portion along the opposite side of the cover for engaging the sloping portion of the flange overlapped by the latter mentioned lip portion, the engaged portion of the flange sloping up and away from the opening towards the overlapping lip, said securing means being threadedly held in said lip portion so that inward threading of the securing means cams the cover down to compress said gasket against the top of the flange so that the cover can be tightly cammed into weathertight engagement with the box when in closed position.

2. The subject matter of claim 1, in which the under top portion of said cover adjacent to the inside of said lip includes a gasket extending about the entire inner perimeter of the cover dimensioned to engage the top of said integral flange when said cover is in closed position to thereby provide a sealing relationship.

3. The subject matter of claim 1, including latching members having openings for a padlock, said members being secured respectively to the lip portion of the cover and a portion of said integral flange between said securing means, said openings being in registration only when said gasket in said cover is properly seated in sealing relationship with the top of said integral flange.

4. A weatherproof panel enclosure including, in combination:

(a) a shallow rectangular box structure having length, width and depth dimensions wherein the box has lower and upper mounting means mounting the box to a vertical wall with its depth dimension normal to the wall surface, said box having a front rectangular opening defined by an integral surrounding flange about the complete periphery of the opening;

(b) a rectangular cover having a lip about its entire perimeter and dimensioned such that said lip overlaps said flange when the cover is closed over said opening;

(c) a gasket secured to the underside of the cover within the boundary of said lip to engage the top surface of the flange when the cover is closed;

(d) hinge means secured to a lip portion extending along one vertical side of the cover and a corresponding vertical front side of the box between the flange and the front side of the side edge of the box itself so that said cover can be swung away from the opening through an angle greater than 90°; and (e) securing means passing through a lip portion along the vertical side opposite said first mentioned vertical side of the cover to engage the flange portion overlapped by said latter mentioned lip portion, the engaged portion of said flange sloping away from the front opening towards the overlapping lip, said securing means being threadedly held in said lip portion so that inward threading of the securing means cams the cover down to compress said gasket against the top of the flange and thereby assure a weathertight engagement over the entire perimeter of the flange.

5. The subject matter of claim 4, including latching members having openings for a padlock, said members being secured respectively to the latter mentioned lip portion of said cover and flange of the opening between the securing means, said openings being in registration only when the gasket in said cover is properly seated on the top of said flange over the entire perimeter of the flange.

6. The subject matter of claim 4, in which each of said securing means includes a threaded bolt having a knurled head and a reduced diameter smooth shaft portion intermediate the threads, the end of the bolt having a rounded configuration to provide a camming surface for engagement with the sloping portion of the flange, the lip portion of the cover receiving the securing means having an opening for the bolt and including a threaded member in registration with the opening for threadedly receiving the threads on the bolt, such that the bolt is held captive when the threaded member surrounds the smooth shaft portion; and a spring surrounding the bolt between the head and outer periphery of the opening in said lip portion for biasing the bolt outwardly, said knurled head having an end slot for facilitating rotation of said bolt in threading the same.

7. The subject matter of claim 4, in which said lower and upper mounting means comprise flat rectangular plates each having a slot extending into one end portion and an opening adjacent to the opposite end portion, the said upper mounting means comprising two of said plates with their said one ends secured to the box adjacent to the upper rear corners thereof and the lower mounting means comprising two of said plates with said opposite ends secured adjacent to the rear lower corners of the box so that the slots in the lower plates can receive bolts partially secured into a wall and thence the bolts tightened and thereafter bolts passed through the openings in the upper plates.

* * * * *